(12) United States Patent
Ping

(10) Patent No.: US 6,395,615 B2
(45) Date of Patent: May 28, 2002

(54) SELECTIVE SILICON FORMATION FOR SEMICONDUCTOR DEVICES

(75) Inventor: Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/846,945

(22) Filed: Apr. 30, 2001

Related U.S. Application Data

(63) Continuation of application No. 09/293,636, filed on Apr. 15, 1999, now Pat. No. 6,235,605.

(51) Int. Cl.$^7$ ................................................. H01L 21/20
(52) U.S. Cl. ........................ 438/398; 438/665; 438/964
(58) Field of Search ................................. 438/398, 665, 438/674, 964, 951

(56) References Cited

U.S. PATENT DOCUMENTS

| | | | |
|---|---|---|---|
| 4,497,683 A | 2/1985 | Celler et al. ................. 117/44 |
| 5,407,534 A | 4/1995 | Thakur ....................... 156/662 |
| 5,418,180 A | 5/1995 | Brown ........................ 437/60 |
| 5,597,756 A | 1/1997 | Fazan et al. ................. 438/398 |
| 5,627,094 A | 5/1997 | Chan et al. .................. 438/253 |
| 5,658,381 A | 8/1997 | Thakur et al. ............... 257/309 |
| 5,721,171 A | 2/1998 | Ping et al. ................... 438/398 |
| 5,864,161 A | 1/1999 | Mitani et al. ................ 257/347 |
| 5,915,197 A | 6/1999 | Yamanaka et al. .......... 438/586 |
| 6,235,605 B1 * | 5/2001 | Ping ........................... 438/398 |

* cited by examiner

Primary Examiner—Amir Zarabian
Assistant Examiner—Christian D. Wilson

(57) ABSTRACT

A process to selectively form silicon structures, such as a storage capacitor, by forming a conductive silicon, forming a silicon nitride layer on the conductive silicon substrate, forming a tungsten layer on the silicon nitride layer, patterning the tungsten layer and the silicon nitride layer to expose a underlying portion of the conductive silicon substrate, forming a continuous silicon film on the exposed portion of the conductive silicon substrate and on an adjacent portion of the silicon nitride layer while completely converting the tungsten layer to a tungsten silicide film by presenting a silicon source gas to the semiconductor memory assembly to form a continuous conductive silicon film used as a first capacitor electrode, forming a capacitor dielectric on the first capacitor electrode and the oxide layer, and forming a second capacitor electrode on the capacitor dielectric.

12 Claims, 3 Drawing Sheets

SELECTIVE SILICON FORMATION FOR SEMICONDUCTOR DEVICES

This application is a continuation to U.S. patent application Ser. No. 09/293,636, filed Apr. 15, 1999 now U.S. Pat. No. 6,235,605.

FIELD OF THE INVENTION

This invention relates to semiconductor fabrication processing and, more particularly, to a method for forming polysilicon for semiconductor devices, such as dynamic random access memories (DRAMs).

BACKGROUND OF THE INVENTION

The continuing trend of scaling down integrated circuits has motivated the semiconductor industry to consider new techniques for fabricating precise components at sub-micron levels. Along with the need for smaller components, there has been a growing demand for devices consuming less power. In the manufacture of memory devices, these trends have led the industry to refine approaches to achieve thinner capacitor cell dielectric and surface enhanced storage capacitor electrodes.

In dynamic random access memory (DRAM) devices it is essential that storage node capacitor cell plates be large enough to exhibit sufficient capacitance in order to retain an adequate charge in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices. The ability to densely pack storage cells while maintaining required capacitance levels is a crucial requirement of semiconductor manufacturing technologies if future generations of expanded memory array devices are to be successfully manufactured.

One area of manufacturing technology that has emerged has been in the development of Hemi-Spherical Grain (HSG) silicon. HSG silicon enhances storage capacitance when used to form the storage node electrode without increasing the area required for the cell or the storage electrode height. The available methods include use of Low Pressure Chemical Vapor Deposition (LPCVD), engraving storage electrodes using polysilicon film followed by P-diffusion utilizing $POCl_3$ source gas, a mixture of spin-on-glass (SOG), coating the polysilicon with resist, and HSG formation. The size of the silicon grain formed by these processes may be somewhat random and uncontrolled.

SUMMARY OF THE INVENTION

The present invention comprises a method to selectively deposit HSG silicon at only desired locations. An exemplary implementation of the present invention comprises a process for selectively forming a silicon structure for a semiconductor assembly. The process first forms a silicon rich material on a semiconductor assembly substrate. Next, a silicon resistive material is formed on the silicon rich material and patterned to allow exposure of a portion of the silicon rich material. Next, a continuous silicon film is formed on the silicon rich material while avoiding the formation of a continuous silicon film on the silicon resistive material. This selective deposition of silicon may be accomplished by presenting a silicon source gas and a silicon stripping agent to the semiconductor assembly. The silicon source gas will readily deposit silicon onto the silicon rich material, while the silicon resistive material will not readily accept the formation of a silicon film thereon. To ensure no continuous silicon is formed on the silicon resistive material, a stripping agent is introduced during the silicon deposition step to remove any silicon nucleation on the silicon resistive film.

A second exemplary implementation of the present invention comprises a process for selectively forming a silicon structure for a semiconductor assembly. The process first forms a conductive silicon rich material on a semiconductor assembly substrate. Next, a nonconductive silicon rich material is formed on the conductive silicon rich material. Next, a silicon reactive material is formed on the nonconductive silicon rich material, where the silicon reactive material and the nonconductive silicon rich material are patterned to expose of a portion of the conductive silicon rich material. Next, a continuous silicon film is formed on the conductive silicon rich material and on the nonconductive silicon rich material while converting the silicon reactive film to a silicon reacted film by presenting a silicon source gas to the semiconductor assembly substrate.

DETAILED DESCRIPTION OF THE INVENTION

Exemplary implementations of the present invention are directed to processes for forming selectively deposited silicon in a semiconductor device as depicted in the embodiments of FIGS. 1A, 1B, 2A, 2B and 2C.

Figure 1A:
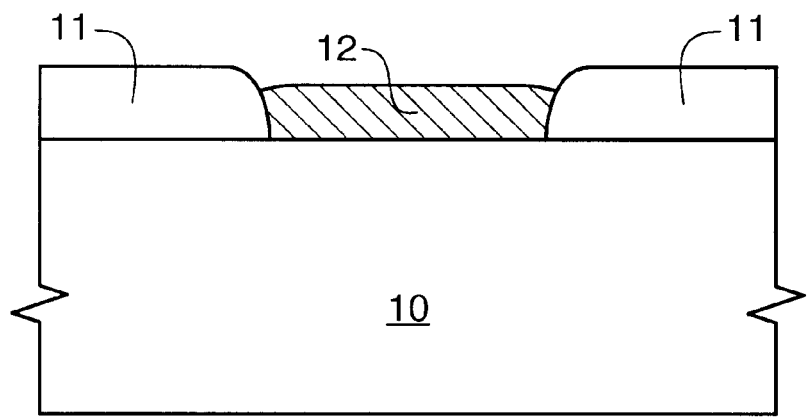
FIGS. 1A and 1B are cross-sectional views depicting semiconductor substrates after selective deposition of silicon, including amorphous silicon (FIG. 1A) and hemispherical grain silicon (FIG. 1B).

Referring to FIG. 1A, substrate 10 is prepared for the processing steps of the present invention. Substrate 10 must be a silicon rich material, such as a conductively doped silicon wafer, a consecutively doped polysilicon plug that connects to an underlying access device. Other examples of preferred silicon rich materials include conductively doped amorphous silicon and the like.

For purposes of the present invention, a silicon rich material is defined as a material that promotes the nucleation of silicon atoms on its surface during a silicon deposition process that presents a silicon source gas to the surface of an in-process semiconductor assembly (such as to substrate 10). A silicon resistive material 11 of a desired pattern is formed on substrate 10. For purposes of the present invention, a silicon resistive material is a material that resists the formation of continuous silicon layer during a silicon deposition process that presents a silicon source gas to its surface. Examples of silicon resistive materials are oxides, boro-phospho-silicate glass (BPSG) and tetra-ethyl-ortho-silicate (TEOS).

Next, silicon rich material 10 and silicon resistive material 11 are subjected to a silicon deposition step. The silicon deposition step will selectively deposit silicon on the silicon rich material while depositing little or no silicon on silicon resistive material 11. Any formation of silicon deposits that do occur on silicon resistive material 11 will simply amount to silicon nucleation deposits that do not form a continuous film, nor are the silicon nucleation deposits conductive.

The selective deposition of silicon is accomplished by selecting deposition gases that chemically respond differently to certain materials. The proper deposition gases will be selective to the chemical makeup of substrate 10 and material 11, in that the chemical reactions between the deposition gases and the materials will cause silicon deposition to occur on the silicon rich material and be resistive to the deposition of silicon on the silicon resistive material. For example, one implementation of the present invention uses a silicon source gas, such as silane, in combination with a silicon-stripping agent, such as hydrochloric acid (HCl), in this deposition step. The HCl may be introduced insitu with silane gas or the HCl may be introduced in the middle of the silicon deposition step for a period of time. Another option is to present silane gas for a period of time, then turn off the silane gas, introduce HCl for a period of time, then turn off the HCl and turn on the silane gas again. These steps may be repeated as needed so that silicon is effectively deposited on the silicon rich material, while being effectively stripped from the silicon resistive material.

These implementations of the deposition source gas in combination with HCl will accomplish the desired results of the present invention. The silicon atoms (present in the silane) will nucleate and bond with the silicon rich material of substrate 10 to form a continuous silicon film thereon, while resisting bonding with silicon resistive material 11. If silicon nucleation does begin to occur on the silicon resistive material 11, the hydrochloric acid will provide insitu cleaning and effectively strip any silicon formation from material 11. The selectively deposited silicon may also be an insitu conductively doped silicon. Any silicon deposits remaining on silicon resistive material 11 will not form a continuous silicon film.

Alternatively, the material selected for material 11 may be a silicon reactive material that reacts with silicon to form a silicon compound component. The makeup of this silicon compound component is such that by using a selective etching chemistry the selective etch will remove the reacted silicon compound component while leaving, any non-reacted silicon, as well as any underlying material, intact. Examples of a silicon reactive material include refractory metals, such as tungsten, which would react with silicon to form tungsten silicide ($WSi_x$).

When selecting a silicon reactive material for material 11, the final process results in the formation of selective silicon by the use of several steps that differ from the first exemplary implementation of the present invention. First a silicon reactive material is substituted for a silicon resistive material. After silicon reactive material 11 is formed, silicon deposition follows whereby the silicon atoms present in the source gas will nucleate and form a continuous silicon film on silicon rich material 10, while the silicon atoms will react with silicon reactive material 11 to form the reacted silicon compound component mentioned previously. It is important that the entire film of silicon reactive material 11 is converted to a reacted silicon compound so that a subsequent selective etch can remove the entire reacted silicon and at the same time leave the deposited silicon film on silicon rich material 10. For example, to selectively remove $WSi_x$ a dry isotropic etch can be used that will remove the $WSi_x$ and stop on the deposited silicon film. Another method to selectively remove the $WSi_x$ would be to use a selective wet etch chemistry. For example, using $NH_4OH:H_2:H_2$ would remove $WSi_x$ at approximately 50 angstroms/minute and remove silicon at approximately 5 angstroms/minute.

Replacing silicon resistive material with a silicon reactive material and implementing the selective etch step described can be used in the following exemplary implementations of the present invention as discussed for FIGS. 1B–2C. Therefore, though only the embodiment of using silicon resistive material is discussed in the following embodiments, that is not to be construed as limiting these embodiments to use of only a silicon resistive material.

Figure 1B:
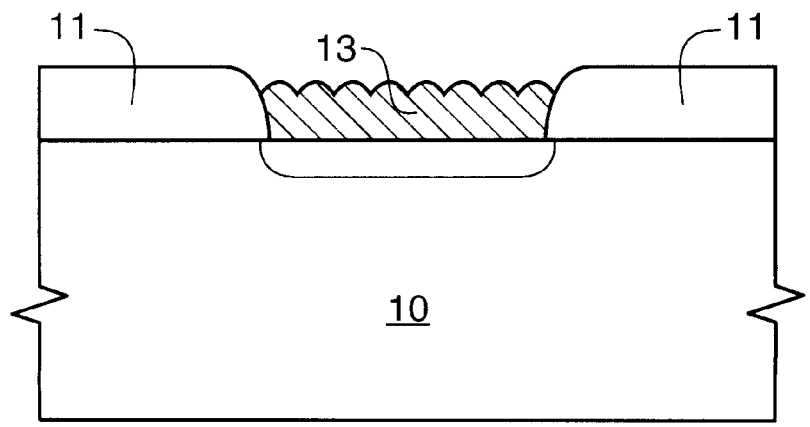

FIG. 1B depicts a second exemplary implementation of the present invention. The concepts demonstrated in FIG. 1A are used here as well, except in this embodiment the selectively deposited silicon material 13 is either amorphous silicon or hemispherical grain (HSG) silicon. If the material of choice is amorphous silicon, then the amorphous silicon can be subjected to an annealing step in order to convert the amorphous silicon to HSG silicon.

Figure 2A:
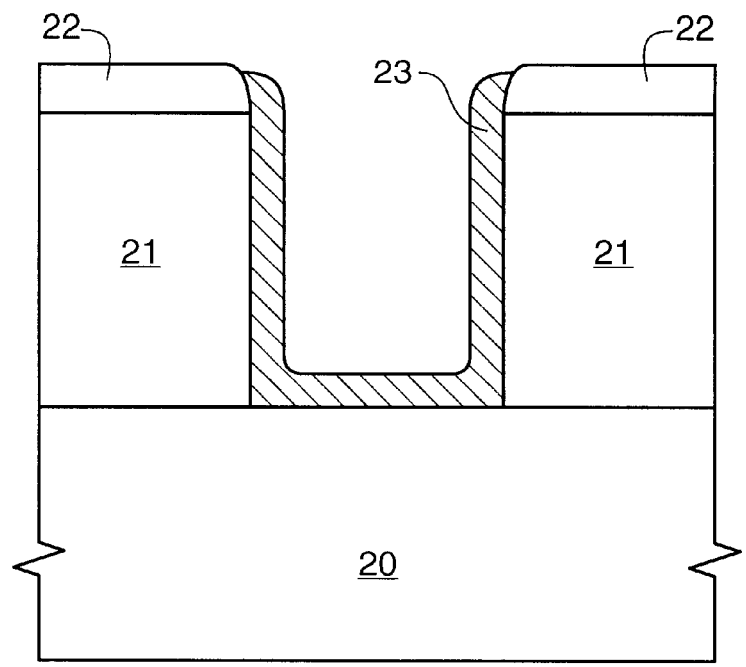
FIGS. 2A and 2B are cross-sectional views depicting semiconductor substrates including a recessed feature after selective deposition of silicon, including amorphous silicon (FIG. 2A) and hemispherical grain silicon (FIG. 2B).

FIG. 2A depicts a third exemplary implementation of the present invention. The concepts demonstrated in FIG. 1A are used here as well, except in this embodiment a more complex structure is formed. In FIG. 2A, substrate 20 is prepared for the processing steps of the present invention. Again, substrate 20 must be a silicon rich material as defined previously. Next, a second silicon rich material 21 is formed on substrate 20. Silicon rich material 21 must be an insulator and it is preferred that silicon rich material 21 be silicon nitride. After the formation of material 21, a silicon resistive material 22 is formed on insulation material 21. Materials 21 and 22 are then patterned and etched as shown to a desired width and depth preceding a subsequent deposition of selective silicon. Silicon rich materials 20 and 21 and silicon resistive material 22 are subjected to a silicon deposition step. The silicon deposition step will selectively deposit silicon layer 23 on the silicon rich materials 20 and 21 while depositing little or no silicon on silicon resistive material 22. The selective deposition of silicon is accomplished by the selective deposition method described in the first exemplary implementation.

Figure 2B:
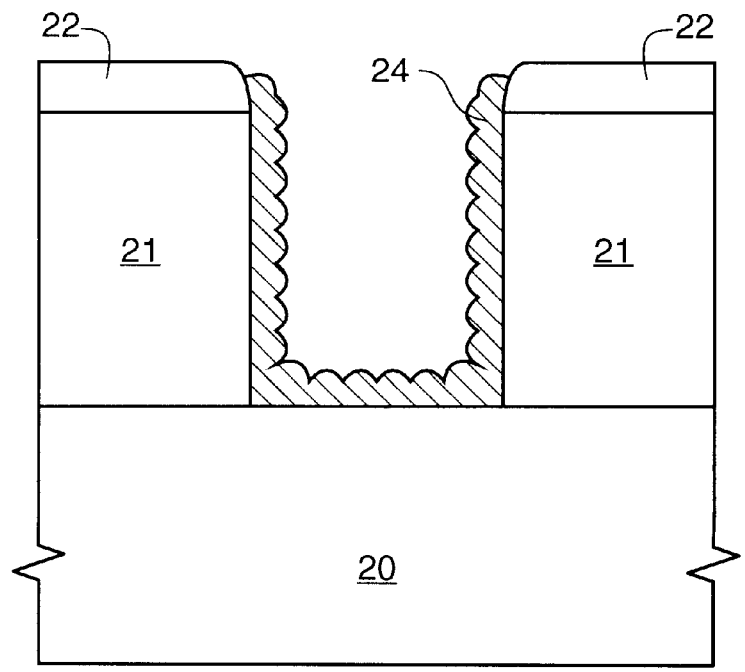
Figure 2C:
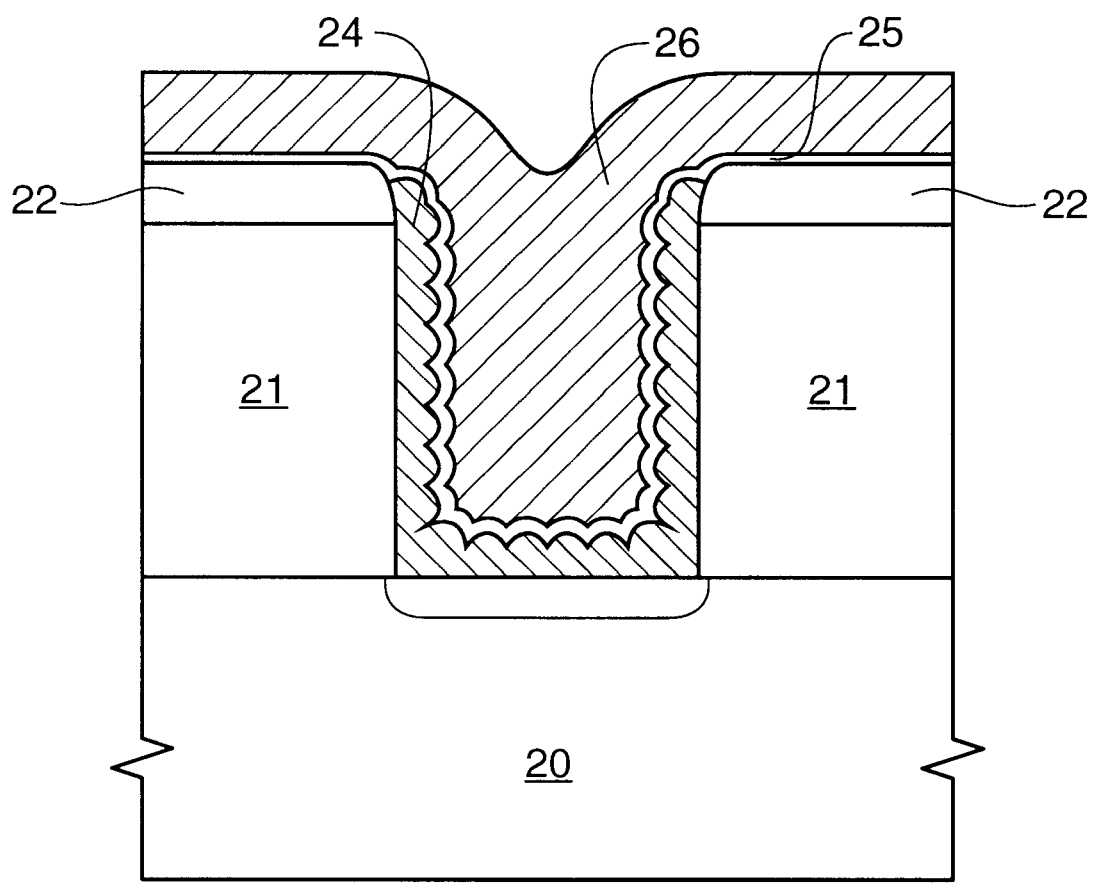
FIG. 2C is a cross-sectional view of the structure of FIG. 2B taken after the formation of a capacitor.

FIGS. 2B–2C depict a fourth exemplary implementation of the present invention. The concepts demonstrated in FIG. 2A are used here as well, except that in this embodiment the selectively deposited silicon material 24 is either amorphous silicon or hemispherical grain (HSG) silicon. If the material of choice is amorphous silicon, then the amorphous silicon can be subjected to an annealing step in order to convert the amorphous silicon to HSG silicon.

Referring now to FIG. 2C, HSG silicon 24 is conductively doped either during deposition or implanted with conductive dopants after deposition. Next, a capacitor dielectric layer 25 is formed over material 22 and silicon material 24. Finally, conductive material 26 is formed over dielectric layer 25 to complete a process utilizing the present invention to form a storage capacitor. The structure is then completed in accordance with fabrication process known to those skilled in the art.

In any of the above exemplary implementations of the present innovation, when the desired final silicon layer is HSG silicon, a quality HSG silicon film can be a formed by several methods. One preferred method is to deposit amorphous silicon at a temperature range of approximately 550° C. to 560° C. and then subject the amorphous silicon film to an anneal at a temperature of 560° C. to 650° C. to convert the silicon film to HSG silicon. Another preferred method is to deposit amorphous silicon at a temperature of 560° C. to 650° C., while seeding with a silicon based gas (such as SiH$_4$, SiH$_6$, etc.) in combination with an inert gas (such as N$_2$, He$_2$, etc.). Afterwards, the deposited amorphous silicon film is subjected to an anneal at a temperature of 560° C. to 650° C. to convert the silicon film to HSG silicon.

It is to be understood that although the present invention has been described with reference to several preferred embodiments, various modifications, known to those skilled in the art, such as utilizing the disclosed methods to form programmable floating gate devices, may be made to the process steps presented herein without departing from the invention as recited in the several claims appended hereto.

U.S. Pat. Nos. 5,407,534, 5,418,180, 5,658,381 and 5,721,171 contain disclosure concerning HSG formation and are hereby incorporated by reference as if set forth in their entirety.

What is claimed is:

1. A process for selectively forming a silicon structure for a semiconductor assembly, said process comprising the steps of:

forming a layer of silicon rich material on a substrate;

forming a pattern of silicon reactive material on said silicon rich material layer to expose a portion of said silicon rich material layer;

presenting a silicon source gas to form a continuous silicon film on said silicon rich material layer while completely converting said silicon reactive material to a silicon reacted film; and removing said silicon reacted film.

2. The process as recited in claim 1, wherein presenting said silicon source gas comprises presenting silane.

3. The process as recited in claim 1, wherein forming said silicon rich material comprises forming a conductive material.

4. The process as recited in claim 1, wherein forming said silicon reactive material comprises forming a refractory metal.

5. The process as recited in claim 4, wherein forming said refractory metal consists of forming tungsten.

6. The process as recited in claim 4, wherein forming said reacted material comprises forming tungsten silicide.

7. The process as recited in claim 4, wherein forming said silicon film comprises forming Hemi-spherical grain silicon.

8. The process as recited in claim 4, wherein forming said silicon film comprises forming amorphous silicon.

9. The process as recited in claim 8, further comprising converting said amorphous silicon to Hemi-spherical grain silicon.

10. A process for selectively forming a silicon structure for a semiconductor assembly, said process comprising the steps of:

forming a layer of conductive silicon rich material on a substrate;

forming a layer of nonconductive silicon rich material on said conductive silicon rich material layer;

forming a layer of silicon reactive material on said nonconductive silicon rich material layer;

patterning said silicon reactive material layer and said nonconductive silicon rich material layer to expose a portion of said conductive silicon rich material layer;

presenting a silicon source gas to form a continuous silicon film on said exposed portion of said conductive silicon rich material layer and on said nonconductive silicon rich material layer while converting said silicon reactive film to a silicon reacted film; and removing said silicon reacted film.

11. A process for selectively forming a silicon structure for a semiconductor assembly, said process comprising the steps of:

forming a conductive silicon substrate;

forming a silicon nitride layer on said conductive silicon substrate;

forming a tungsten layer on said silicon nitride layer;

patterning said tungsten layer and said silicon nitride layer to expose of a portion of said conductive silicon substrate;

presenting a silicon source gas to form a continuous silicon film on said exposed portion of said conductive silicon substrate and on said silicon nitride layer while completely converting said tungsten layer to a tungsten silicide film; and removing said tungsten silicide film.

12. A process for fabricating a storage capacitor electrode in a semiconductor memory assembly, said process comprising the steps of:

forming a conductive silicon substrate;

forming a silicon nitride layer on said conductive silicon substrate;

forming a tungsten layer on said silicon nitride layer;

patterning said tungsten layer and said silicon nitride layer to expose of a portion of said conductive silicon substrate;

presenting a silicon source gas to form a continuous silicon film on said exposed portion of said conductive silicon substrate and on said silicon nitride layer while completely converting said tungsten layer to a tungsten silicide film; and removing said tungsten silicide film.

* * * * *